United States Patent
Hsieh

(10) Patent No.: US 8,253,164 B2
(45) Date of Patent: Aug. 28, 2012

(54) FAST SWITCHING LATERAL INSULATED GATE BIPOLAR TRANSISTOR (LIGBT) WITH TRENCHED CONTACTS

(75) Inventor: Fu-Yuan Hsieh, Banciao (TW)

(73) Assignee: Force MOS Technology Co., Ltd., Banciao, Taipei County (TW)

( * ) Notice: Subject to any disclaimer, the term of this patent is extended or adjusted under 35 U.S.C. 154(b) by 49 days.

(21) Appl. No.: 12/977,297

(22) Filed: Dec. 23, 2010

(65) Prior Publication Data

US 2012/0161201 A1  Jun. 28, 2012

(51) Int. Cl.
*H01L 29/739* (2006.01)
(52) U.S. Cl. .......... 257/140; 257/141; 257/E29.197
(58) Field of Classification Search .......... 257/140–141, 257/E29.197
See application file for complete search history.

(56) References Cited

U.S. PATENT DOCUMENTS 5,891,776 A * 4/1999 Han et al. .................. 438/274

* cited by examiner

*Primary Examiner* — Cuong Q Nguyen
*Assistant Examiner* — Tran Tran
(74) *Attorney, Agent, or Firm* — Bacon & Thomas, PLLC

(57) ABSTRACT

A lateral insulated gate bipolar transistor (LIGBT) includes a drain-anode adjoining trenched contact penetrating through an insulating layer and extending into an epitaxial layer, directly contacting to a drain region and an anode region, and the drain region vertically contacting to the anode region along sidewall of the drain-anode adjoining trenched contact. The LIGBT further comprises a breakdown voltage enhancement doping region wrapping around the anode region. The LIGBTs in accordance with the invention offer the advantages of high breakdown voltage and low on-resistance as well as high switching speed.

17 Claims, 12 Drawing Sheets

FAST SWITCHING LATERAL INSULATED GATE BIPOLAR TRANSISTOR (LIGBT) WITH TRENCHED CONTACTS

FIELD OF THE INVENTION

This invention relates in general to semiconductor devices, and more particularly, to an improved and novel device configuration for providing a fast switching lateral insulated gate bipolar transistor (LIGBT) with trenched contacts with higher breakdown voltage and lower on-resistance as well as higher switching speed.

BACKGROUND OF THE INVENTION

The insulated gate bipolar transistor (hereinafter IGBT) is an integrated combination of a bipolar transistor and a metal oxide semiconductor field effect transistor and has become commercially successful due to its superior on-state characteristics and excellent safe-operating area. IGBTs in integrated circuits are commonly configured as lateral insulated gate bipolar transistors (hereinafter LIGBTs) and fabricated using a planar process sequence to minimize cost and complexity of the integrated circuit manufacturing operation.

FIG. 1A is a cross sectional view showing a conventional LIGBT 100 of prior art. The LIGBT 100 of FIG. 1A comprises: a P- substrate 101; an N epitaxial layer 103 on top surface of the P-substrate 101; a P buried layer 102 with higher doping concentration than the P- substrate 101 and located at a part of the top surface of the P-substrate 101 and beneath an n+ source (cathode) region 107 near top surface of the N epitaxial layer 103; a p++ source contact doped region 105 provided in the N epitaxial layer 103 and adjacent to a p body region 104 and the n+ source region 107. A channel region of the illustrated LIGBT 100 is formed near top surface of the p body region 104 between the n+ source region 107 and the N epitaxial layer 103; a p+ anode region 108 located near the top surface of the N epitaxial layer 103 and spaced apart from the p region 104; a source metal 111 and a drain metal 113 contacted with the n+ source (cathode) region 107 and the p++ source contact doped region 105, and the p+ anode region 108 by planar contact, respectively. The LIGBT 100 of FIG. 1A offers several important advantages over lateral diffusion metal oxide semiconductor, including high current handling capabilities, low on-resistance and high breakdown voltage. However, it has suffered from a significant drawback of switching speed because there is no n+ drain region provided for removal of electrons (minority carriers) during turn-off process. During turn-on process, the p+ anode region 108 injects holes (majority carriers) into drift region and the n+ source (anode) region 107 injects electrons into the drift region through the channel to form a low-resistance plasma modulation region. During turn-off process, the holes in the plasma modulation region are removed by flowing through the p+ anode region 108 but the electrons are removed by recombination of the electrons and the holes. Therefore, the turn-off process is determined by the recombination of electrons, and since no contact is provided for the removal of the electrons, the turn-off time is relatively long in the range of 3-10 microseconds, while turn-on time is much less than 1 microsecond.

A typical prior art fast switching LIGBT 200 is shown in FIG. 1B. Similar fast switching LIGBTs are shown in U.S. Pat. No. 4,989,058. Besides those in common with the LIGBT 100 of FIG. 1A, the LIGBT 200 of FIG. 1B comprises an additional n+ drain region 209 adjacent to the p+ anode region 208 to remove the electrons (minority carriers) during the turn-off process as discussed above. Therefore, the turn-off time of the LIGBT 200 of FIG. 1B is shorter than that of the LIGBT of FIG. 1A. However, the LIGBT 200 has its own constrain which is that on-resistance is significantly increased because triggered voltage Vds for holes (majority carriers) injection is larger than the typical value of 0.7 V for the LIGBT 100 as shown in FIG. 2 due to an additional resistance $R_p$ (as illustrated in FIG. 1B) existing underneath the p+ anode region 208 besides Rd (as illustrated in FIG. 1A and FIG. 1B). The Triggered voltage Vds is: $I*(R_d+R_p)=IR_d+IR_p \approx IR_d+0.7 \text{ V}>0.7 \text{ V}$, where I is the current flowing through the drift region to the n+ drain region 209. From FIG. 2 it can be seen that, the triggered voltage Vds of the LIGBT 100 is about 0.7V and the triggered voltage Vds of the LIGBT 200 is about 1.2 V as shown in FIG. 2.

Accordingly, it would be desirable to provide a new and improved LIGBT that has both low on-resistance and high switching speed.

SUMMARY OF THE INVENTION

It is therefore an aspect of the present invention to provide a new and improved LIGBT to solve the problems discussed above. According to the present invention, there is provided a LIGBT, comprising: a drain-anode adjoining trenched contact penetrating through an insulating layer and extending into an epitaxial layer of a first conductivity type, directly contacting to a drain region having the first conductivity type and an anode region of a second conductivity type; and said drain region vertically contacting to said anode region along sidewall of the drain-anode adjoining trenched contact.

By providing a LIGBT with the drain-anode adjoining trenched contacts described above, please refer to a preferred embodiment LIGBT 300 shown in FIG. 3, the triggered voltage Vds is reduced to about 0.7 V as illustrated in FIG. 4, which is the same value as that of the LIGBT 100 of FIG. 1A because no $R_p$ exists in the LIGBT according to the present invention. Meanwhile, the on-resistance of the present invention is lower than that of the LIGBT 100 of FIG. 1A, because there is current flowing through from drain to source before the triggered voltage. Moreover, the switching speed of the present invention is as same as that of the LIGBT 200 of FIG. 1B due to the drain region provided for the removal of minority carriers.

In another preferred embodiment, the LIGBT according to the present invention further comprises: a trenched gate in active area; a source (cathode) trenched contact penetrating through the insulating layer and a source (cathode) region having the first conductivity type, and further extending into a body region of the second conductivity type within the epitaxial layer; and a heavily doped contact region of the second conductivity type within the body region and below the source (cathode) region, surrounding sidewall and bottom of the source (cathode) trenched contact.

In yet another preferred embodiment, the LIGBT according to the present invention further comprises: a planar gate; a source (cathode) trenched contact penetrating through the insulating layer and a source (cathode) region having the first conductivity type, and further extending into a first body region having the second conductivity type within the epitaxial layer; a second body region disposed within said first body region and at least surrounding bottom of said source region, having said second conductivity type with doping concentration higher than said first body region; a heavily doped contact region having the second conductivity type within the second body region and below the source (cathode) region and surrounding sidewall and bottom of the source (cathode) trenched contact.

In yet another preferred embodiment, the LIGBT of the present invention further comprises one or more detail features as below: the drain region of the first conductivity type surrounds upper portion of the sidewall of the drain-anode adjoining trenched contact while the anode region of the second conductivity type surrounds lower portion of the sidewall of the drain-anode adjoining trenched contact and wraps around bottom of the drain-anode adjoining trenched contact; the LIGBT further comprises a breakdown voltage enhancement doping region of the first conductivity type wrapping around the anode region, wherein the breakdown voltage enhancement doping region has a doping concentration lower than the drain region and higher than the epitaxial layer. Another preferred embodiment further comprises one or more detail features as below: the anode region of the second conductivity type surrounds upper portion of the sidewall of the drain-anode adjoining trenched contact while the drain region of the first conductivity type surrounds lower portion of the sidewall of the drain-anode adjoining trenched contact and wraps around bottom of the drain-anode adjoining trenched contact; the LIGBT further comprises a breakdown voltage enhancement doping region of the first conductivity type wrapping around the anode region, wherein the breakdown voltage enhancement doping region has a doping concentration lower than the drain region and higher than the epitaxial layer. The drain-anode adjoining trenched contact is filled with Ti/TiN/Al or Co/TiN/Al or Ta/TiN/Al alloys, which also acts as a drain-anode metal layer. Alternatively, the drain-anode adjoining trenched contact is filled with Ti/TiN/W or Co/TiN/W or Ta/TiN/W as metal plug connecting to an Al alloys layer as a drain-anode metal layer; the LIGBT further comprises a Ti or Ti/TiN layer underneath the drain-anode metal layer as an inter-metal contact resistance-reduction layer.

The inventive LIGBT is either discrete device on single chip or integrated with a control IC on single chip.

According to another preferred embodiment, please refer to FIG. 11 for a IGBT 1000, there is provided a hybrid VIGBT(Vertical IGBT)-LDMOS, comprising: a drain trenched contact penetrating through an insulating layer and an epitaxial layer of a first conductivity type, and further extending into a substrate of a second conductivity type undereneath the epitaxial layer; a vertical drain region of the first conductivity type adjacent to the drain trenched contact, extending from top surface of the epitaxial layer to top surface of the substrate or into the substrate, wherein the vertical drain region having a higher doping concentration than the epitaxial layer; and the vertical drain region contacting to a drain-anode metal layer on bottom surface of the substrate. Optionally, in some preferred embodiment, a buffer layer of the first conductivity type is offered between the substrate and the epitaxial layer, wherein the buffer layer has a higher doping concentration than the epitaxial layer, as shown in FIG. 11. In another preferred embodiment, a vertical drain region surrounding sidewalls and bottom of the drain trenched contact does not contact to the substrate.

Another preferred embodiment has similar cross sectional view of the FIG. 11 except that the drain trenched contact penetrates the insulation layer and extends into the epitaxial layer but does not further extend to the substrate. The drain region surrounds sidewalls and bottom of the drain trenched contact and contacts to a drain metal over the insulation layer through the metal plug filled into the drain trenched contact. The drain metal may connect to an anode metal on the bottom surface of the substrate through bonding wires, bonding ribbon or copper clips in a package.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention. In the drawings.

DETAILED DESCRIPTION OF THE EMBODIMENTS

Figure 3:
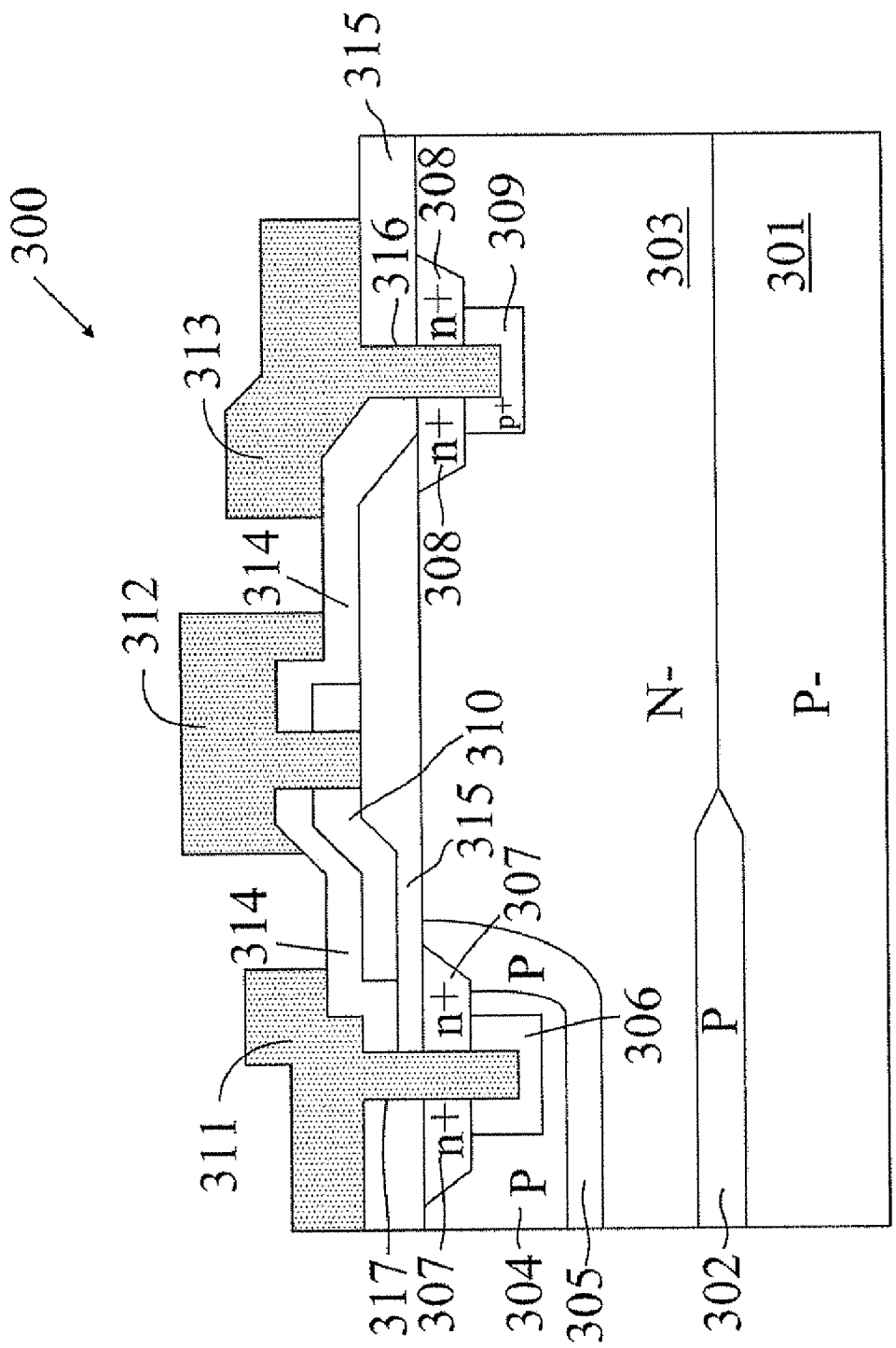
FIG. 3 is a cross sectional view showing a preferred embodiment of the present invention.

FIG. 3 is a cross sectional view showing a LIGBT 300 according to a preferred embodiment of the present invention. The LIGBT 300 of FIG. 3 is formed in an epitaxial layer 303 of a first conductivity type, here n-type, grown onto top surface of a semiconductor substrate 301 of a second conductivity type, here p-type. A P buried layer 302 is located at a part of the top surface of the substrate 301 and beneath an n+ source (cathode) region 307 which formed near top surface of the epitaxial layer 303, wherein the P buried layer 302 has a higher doping concentration than the substrate 301 and the n+ source (cathode) region 307 has a higher doping concentration than the epitaxial layer 303. A first P body region 305 is formed within the epitaxial layer 303 and encompassing the n+ source (cathode) region 307 and forming a channel region underneath a first insulating layer 315 near the top surface of the epitaxial layer 303. A second P body region 304 is formed within the first P body region 305 and at least surrounding bottom of the n+ source (cathode) region 307, having a doping concentration higher than the first P body region 305. A source (cathode) metal layer 311 of Al alloys padded with a barrier layer of Ti/TiN or Co/TiN or Ta/TiN is filled directly into a source (cathode) trenched contact 317 which penetrates through a second insulating layer 314 and the n+ source (cathode) region 307 and further extends into the second P body region 304 to contact with the n+ source (cathode) region 307 and the second P body region 304. Within the second P body region 304, a p+ heavily doped contact region 306 is formed surrounding sidewall and bottom of the source (cathode) trenched contact 317 below the n+ source (cathode) region 307 to reduce the contact resistance between the source (cathode) metal 311 and the second P body region 304, wherein the p+ heavily doped contact region has a higher doping concentration than the second P body region 304. An n+ drain region 308 is formed near the top surface of the epitaxial layer 303 and spaced apart from the first P body region 305, and a p+ anode region 309 is formed within the epitaxial layer 303, below the n+ drain region 308. A drain-anode metal 313 of Al alloys padded with a barrier layer of Ti/TN or Co/TiN or Ta/TiN is directly filled into a drain-anode adjoining trenched contact 316 which penetrates through the first insulating layer 315 and the n+ drain region 308 and further extends into the p+ anode region 309 to vertically contact with the n+ drain region 308 and the p+ anode region 309, wherein the n+ drain region 308 surrounds upper portion of the sidewalls of the drain-anode adjoining trenched contact 316 and the p+ anode region 309 surrounds lower portion of the sidewalls of the drain-anode adjoining trenched contact 316 and wraps around bottom of the drain-anode adjoining trenched contact 316. A gate metal 312 of Al alloys is filled directly into a gate trenched contact penetrating through the second insulating layer 314 to contact with a planar gate 310 of doped poly-silicon layer.

Figure 1A:
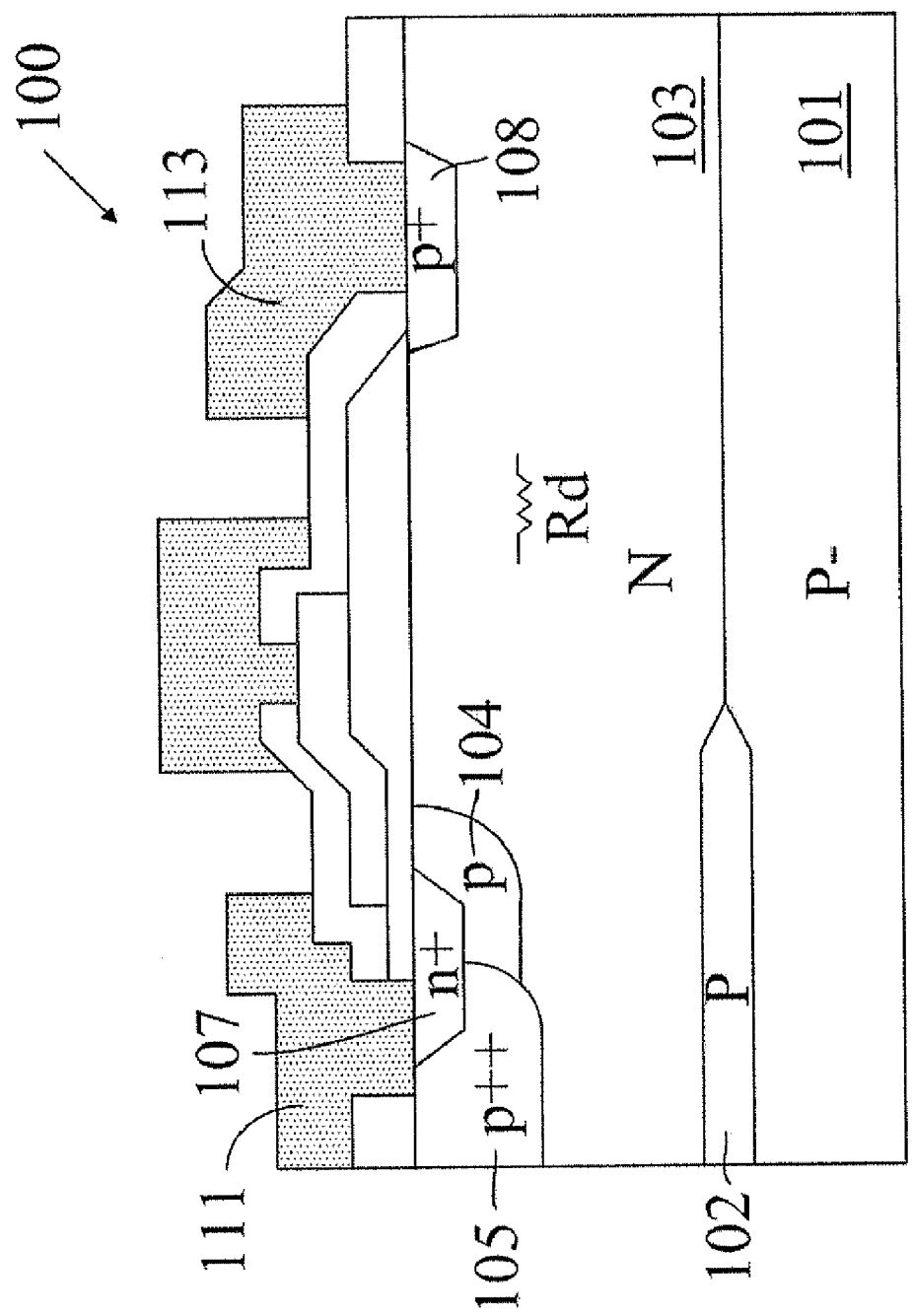
FIG. 1A is a cross sectional view showing a conventional LIGBT of prior art.
Figure 1B:
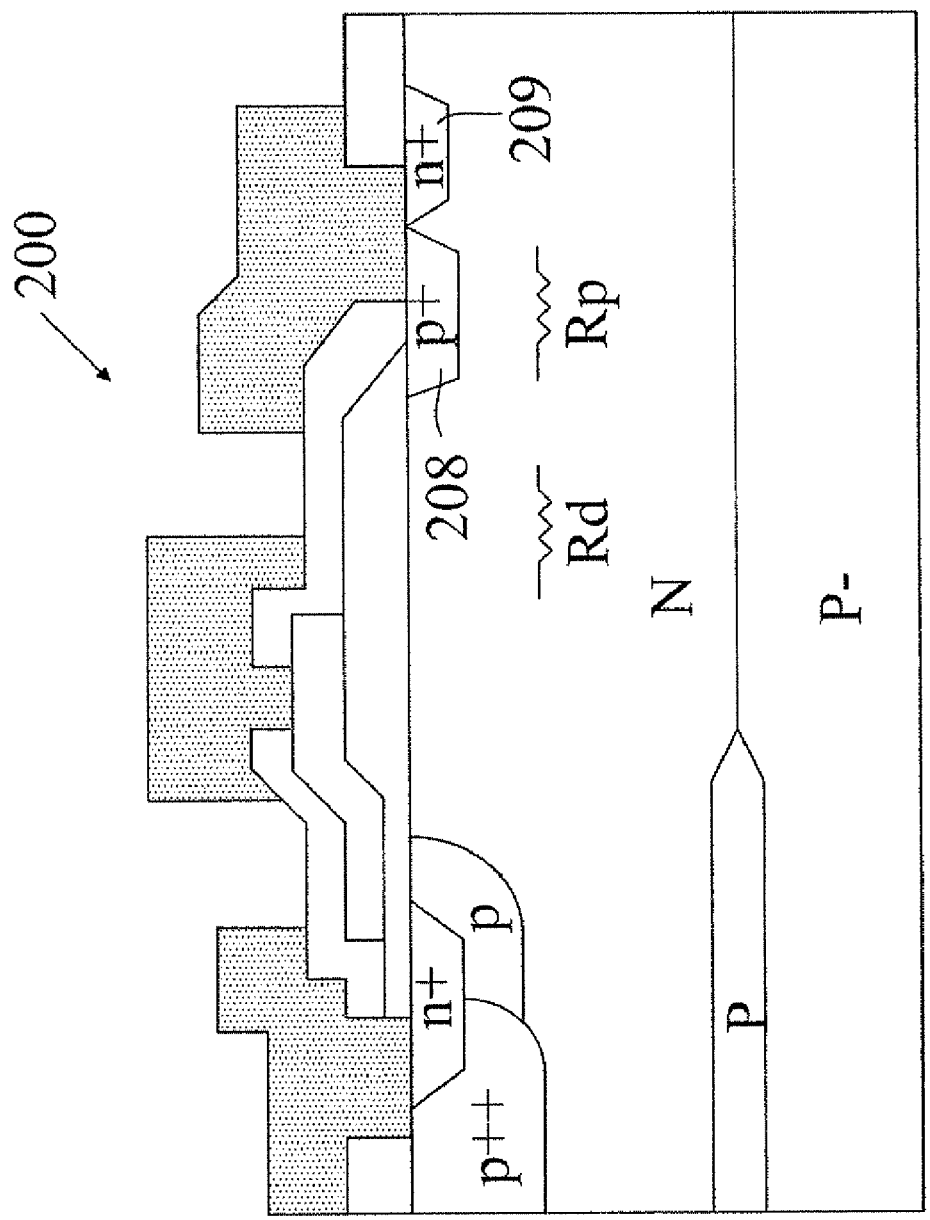
FIG. 1B is a cross sectional view showing a fast switching LIGBT of another prior art.
Figure 2:
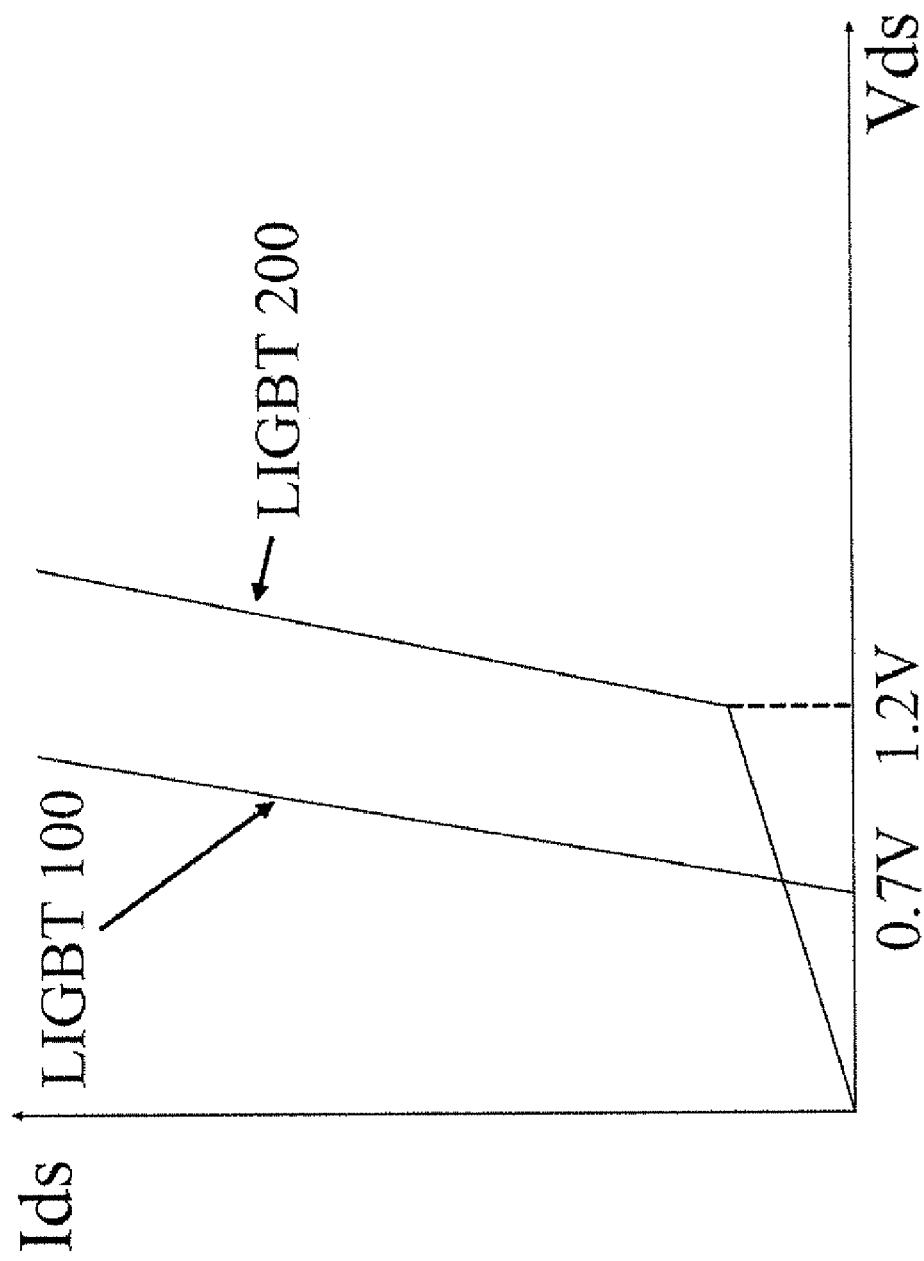
FIG. 2 is a graph showing relationships between Ids and Vds of LIGBT in FIG. 1A and FIG. 1B.
Figure 4:
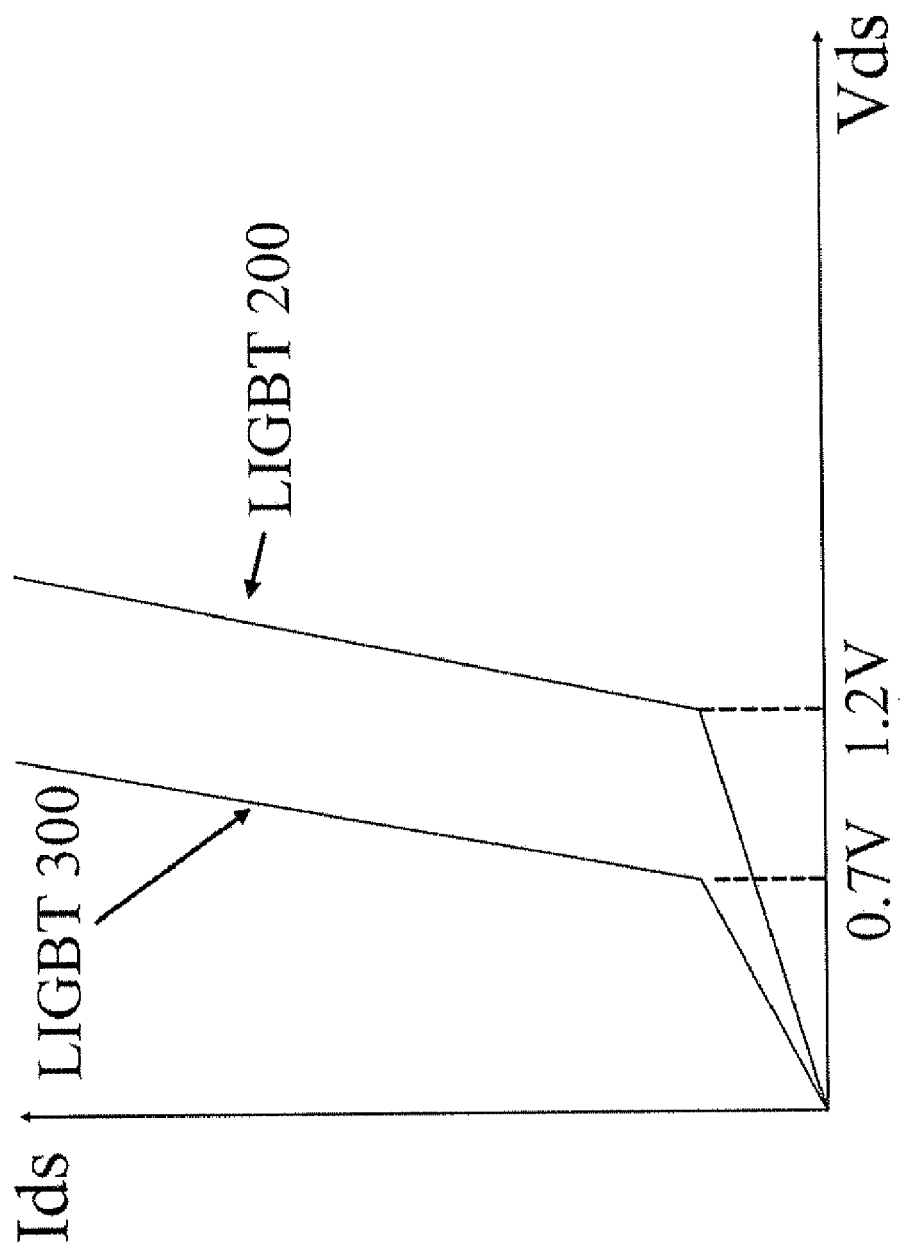
FIG. 4 is a graph showing relationships between Ids and Vds of LIGBT in FIG. 3 and FIG. 1B.

FIG. 4 illustrates Ids-Vds characteristic comparison between LIGBT 300 of FIG. 3 and LIGBT 200 of FIG. 1B, it shows that the triggered voltage of this invention has been reduced to a typical value of 0.7V with higher switching speed.

Figure 5:
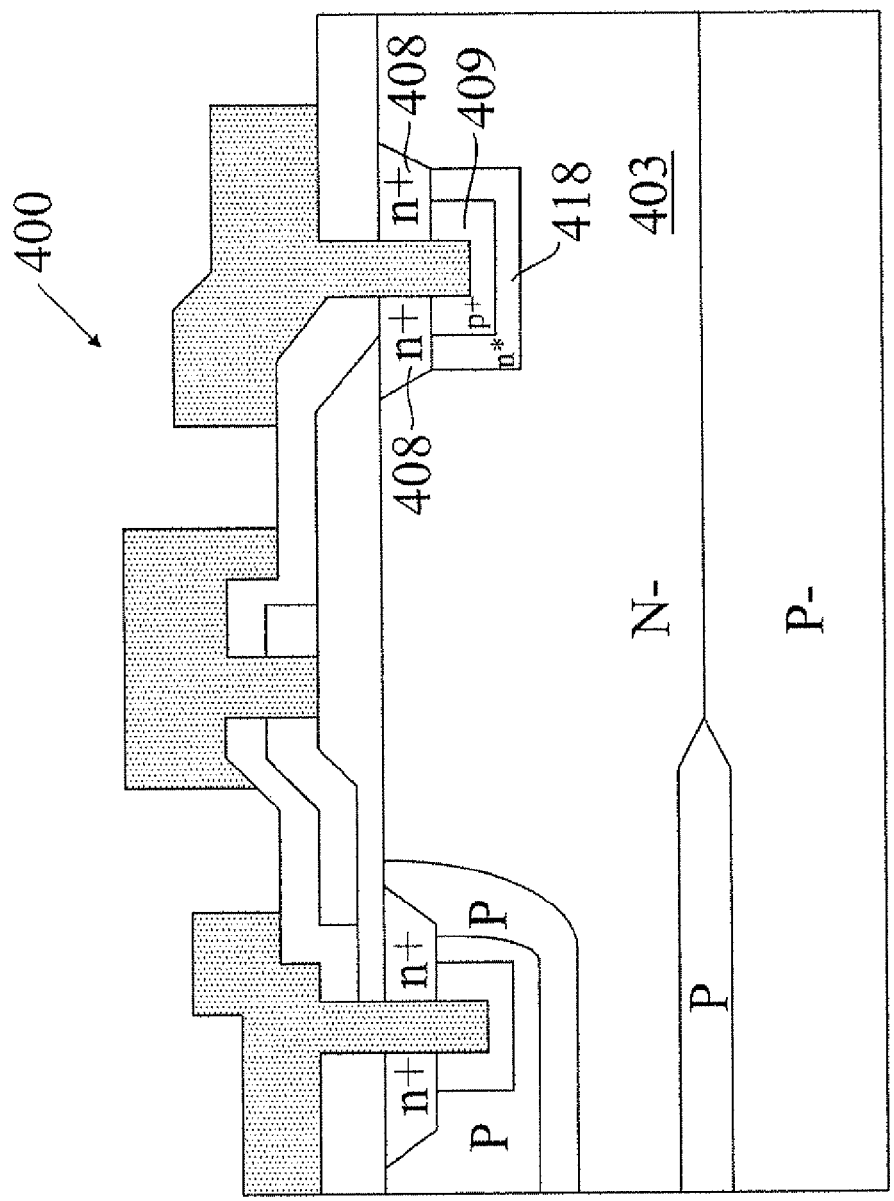
FIG. 5 is a cross sectional view showing another preferred embodiment of the present invention.

FIG. 5 is a cross sectional view showing a LIGBT 400 according to another preferred embodiment of the present invention which has a similar configuration to the LIGBT 300 in FIG. 3 except that, the LIGBT 400 of FIG. 5 additionally provides an n* breakdown voltage enhancement doping region 418 wrapping around the p+ anode region 409 and contacting to the n+ drain region 408, wherein the doping concentration of the n* breakdown voltage enhancement doping region 416 is lower than that of the drain region 408 but higher than that of the epitaxial layer 403. The n* breakdown voltage enhancement doping region is disposed underneath the n+ drain region or wrapping around both the p+ anode region and the n+ drain region.

Figure 6:
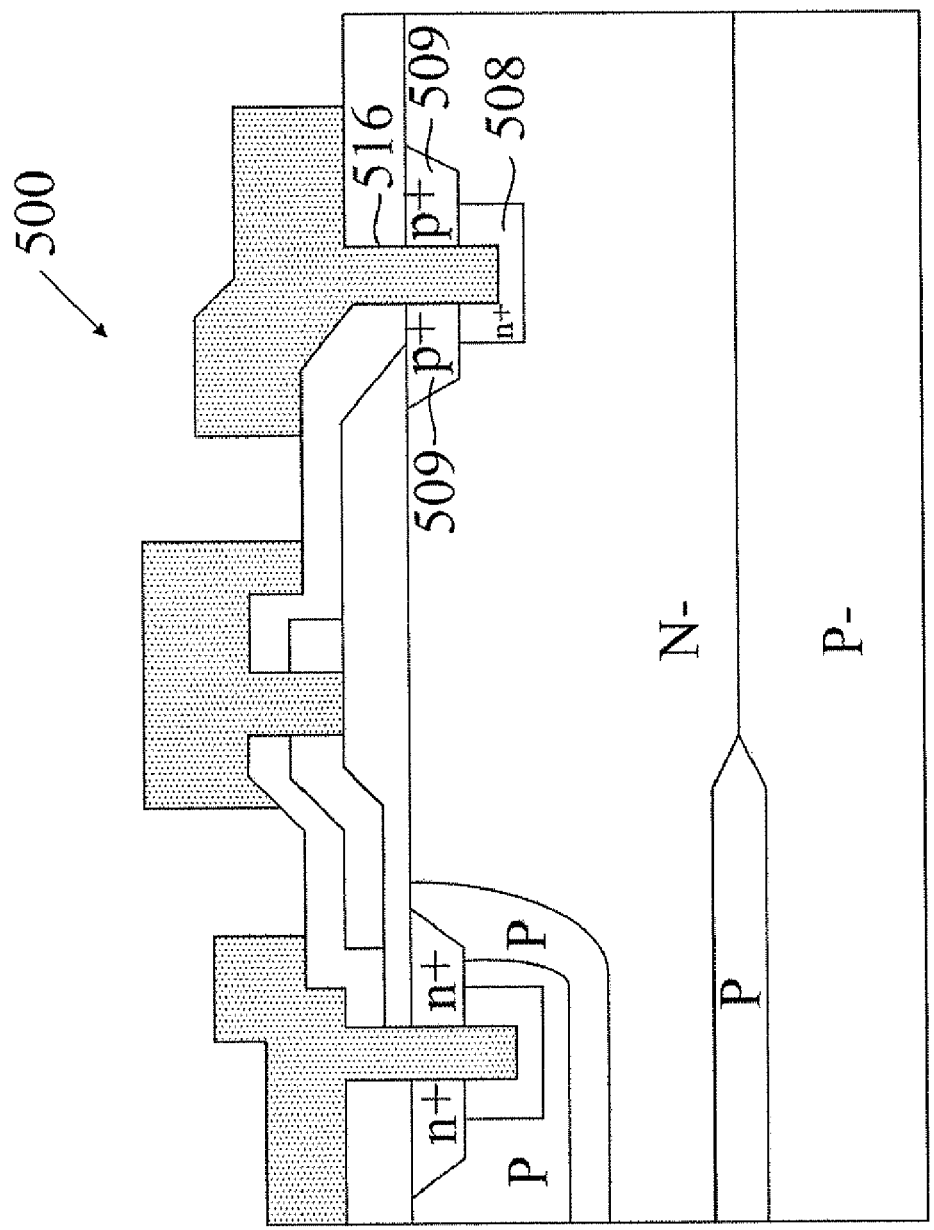
FIG. 6 is a cross sectional view showing another preferred embodiment of the present invention.

FIG. 6 is a cross sectional view showing a LIGBT 500 according to another preferred embodiment of the present invention which has a similar configuration to the LIGBT 300 in FIG. 3 except that, the p+ anode region 509 surrounds upper portion of the sidewall of the drain-anode adjoining trenched contact 516 and the n+ drain region 508 surrounds lower portion of the sidewall of the drain-anode adjoining trenched contact 516 and wraps around bottom of the drain-anode adjoining trenched contact 516.

Figure 7:
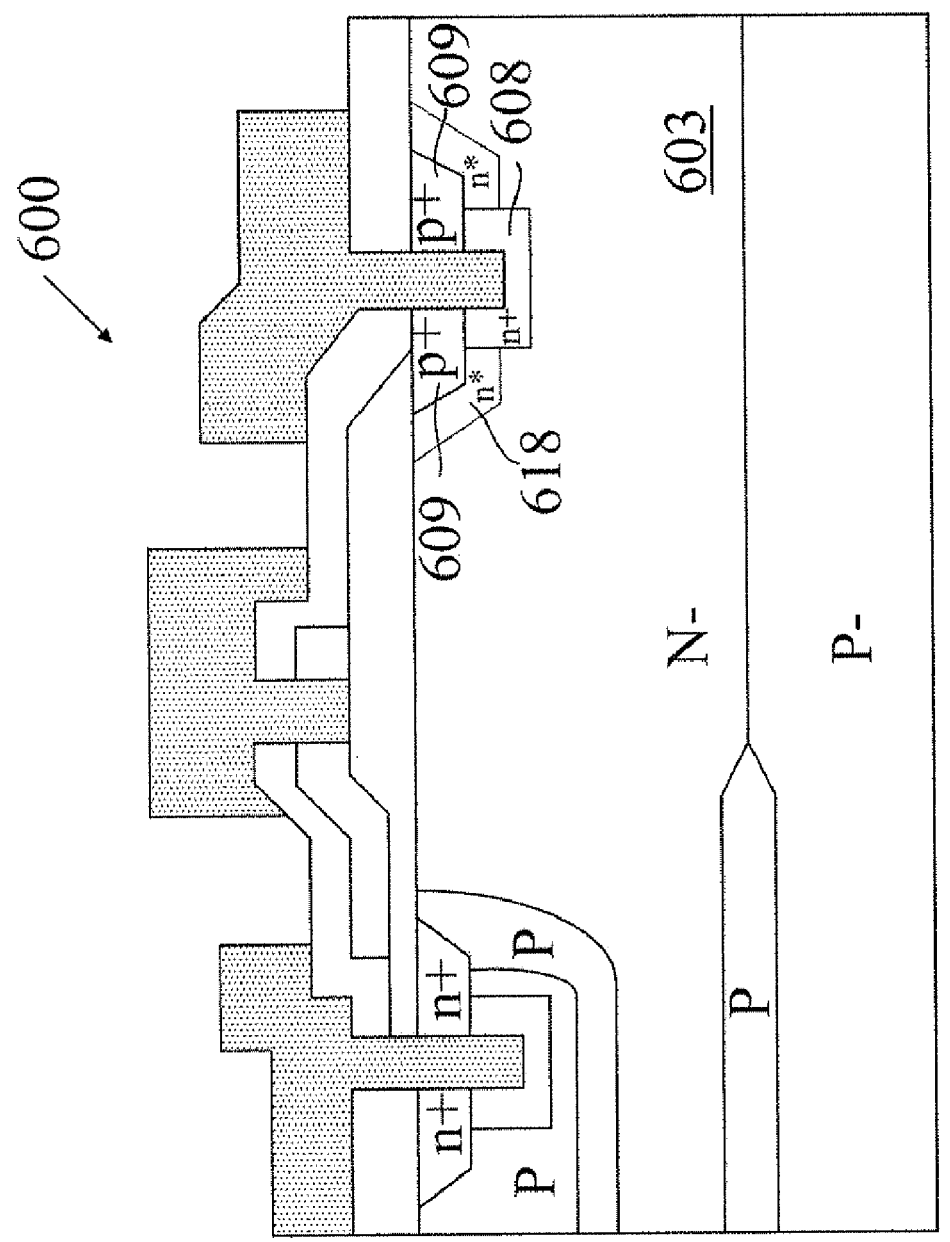
FIG. 7 is a cross sectional view showing another preferred embodiment of the present invention.

FIG. 7 is a cross sectional view showing a LIGBT 600 according to another preferred embodiment of the present invention which has a similar configuration to the LIGBT 500 in FIG. 6 except that, the LIGBT 600 of FIG. 7 additionally provides an n* breakdown voltage enhancement doping region 618 wrapping around the p+ anode region 609 and contacting to the n+ drain region 608, wherein the doping concentration of the n* breakdown voltage enhancement doping region 618 is lower than that of the drain region 608 but higher than that of the epitaxial layer 603. The n* breakdown voltage enhancement doping region may wraps around both the p+ anode region and the n+ drain region as another preferred embodiment.

Figure 8:
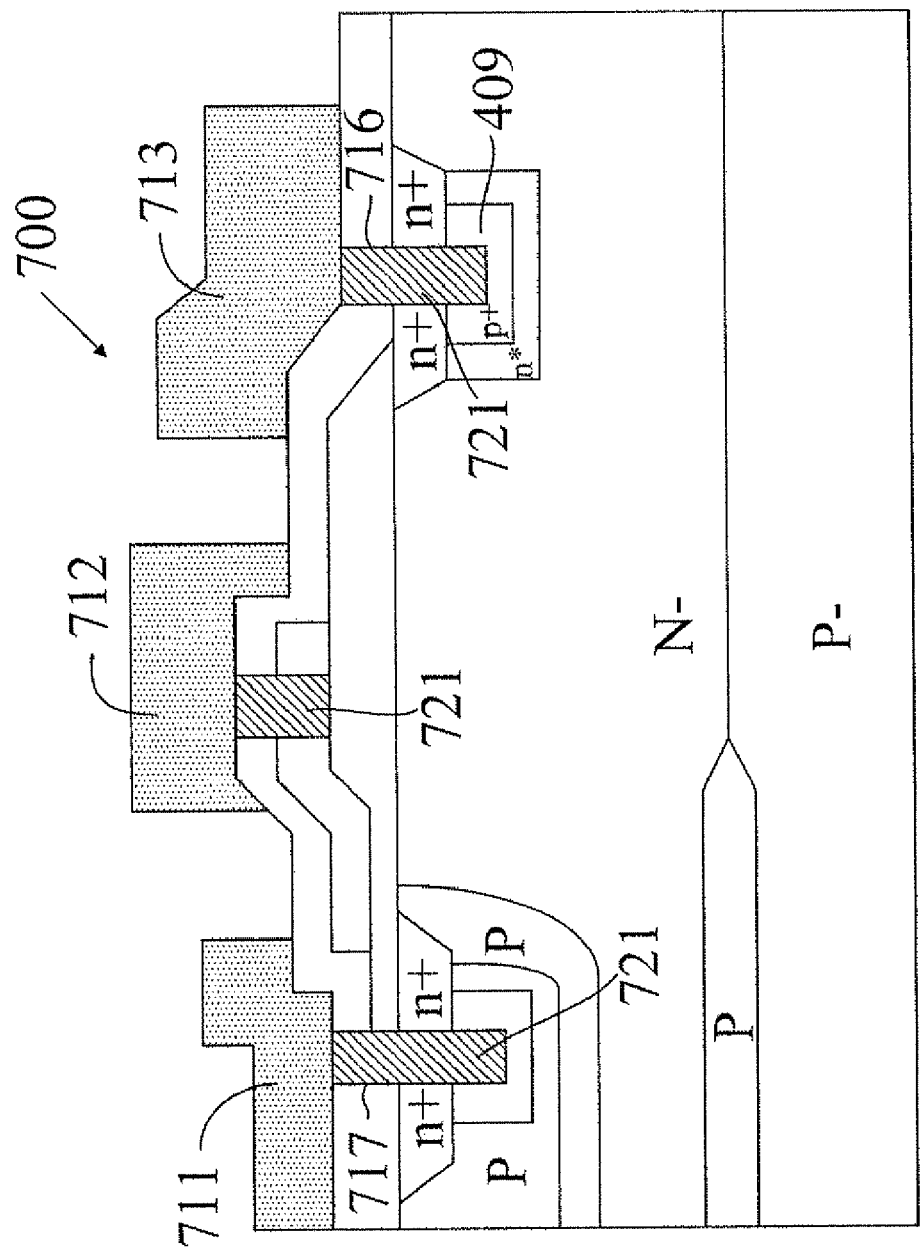
FIG. 8 is a cross sectional view showing another preferred embodiment of the present invention.

FIG. 8 is a cross sectional view showing a LIGBT 700 according to another preferred embodiment of the present invention which has a similar configuration to the LIGBT 400 in FIG. 5 except that, the source (cathode) trenched contact 717, the drain-anode adjoining trenched contact 716 and the gate trenched contact are filled with a tungsten plug 721 padded by a barrier layer of Ti/TiN or Co/TiN or Ta/TiN to respectively contact with the source (cathode) metal 711, the drain-anode metal 713 and the gate metal 712 of Al alloys which is optionally padded by a inter-metal contact resistance-reduction layer of Ti or Ti/TiN.

Figure 9:
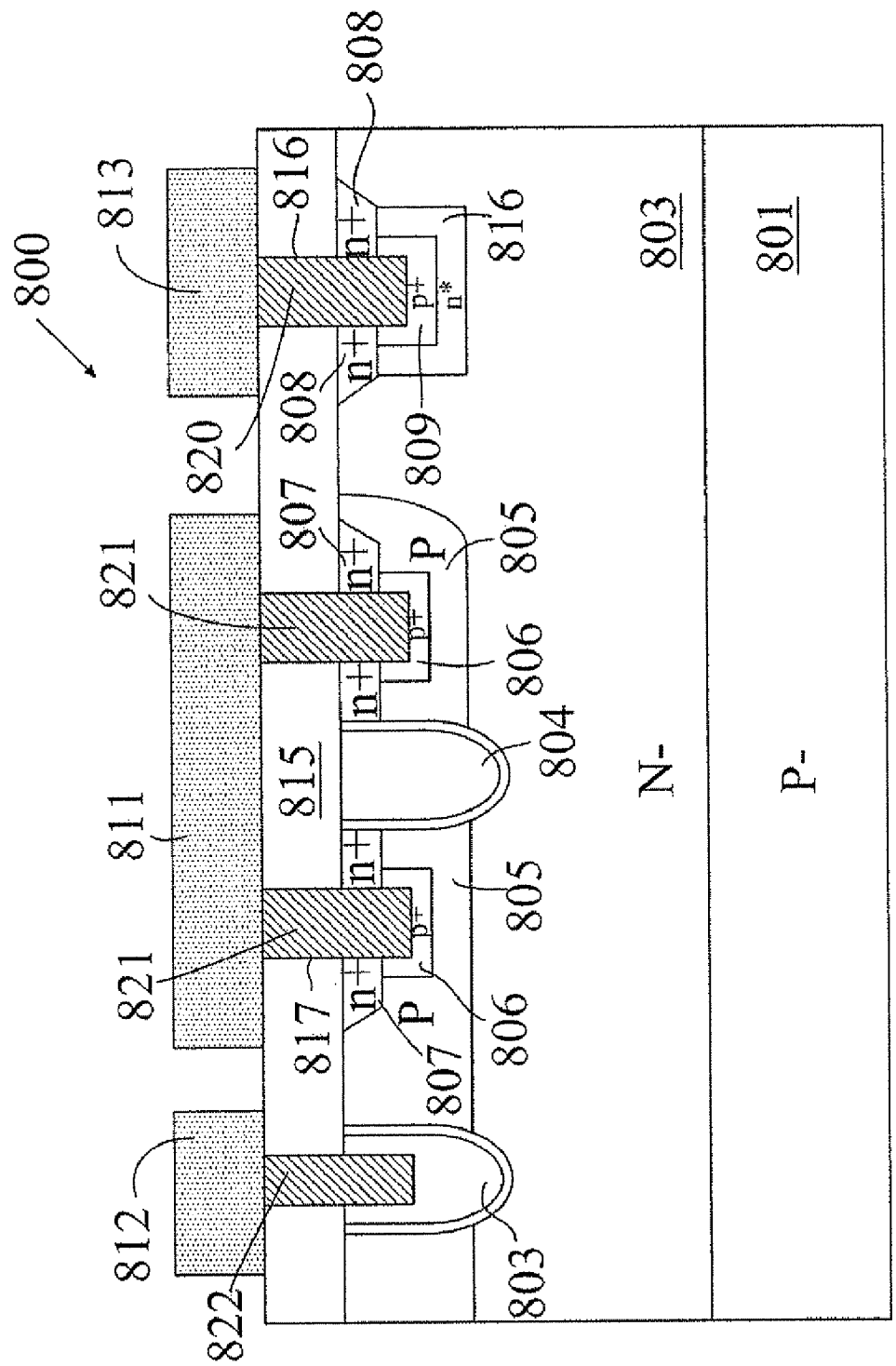
FIG. 9 is a cross sectional view showing another preferred embodiment of the present invention.

FIG. 9 is a cross sectional view showing a LIGBT 800 according to another preferred embodiment of the present invention. The LIGBT of FIG. 9 is formed in an epitaxial layer 803 of a first conductivity type, here n-type, grown onto top surface of a semiconductor substrate 801 of a second conductivity type, here p-type. At least a first type trenched gate 804 in active area and at least a second type trenched gate 803 in gate contact area which are implemented by filling doped poly-silicon layers in a plurality of gate trenches in the epitaxial layer 803. An n+ source (cathode) region 807 are formed near top surface of the epitaxial layer 803 and surrounding top portion of sidewalls of the first type trenched gate 804, wherein the n+ source (cathode) region 807 has a higher doping concentration than the epitaxial layer 803. A P body region 805 is formed within the epitaxial layer 803 and encompassing the n+ source (cathode) region 807 and forming a channel region along the sidewalls of the first type trenched gate 804, wherein the P body region 805 surrounds lower portion of the sidewalls of the first type trenched gate 804. Each of a plurality of source (cathode) trenched contacts 817 filled with a tungsten plug 821 padded by a barrier layer of Ti/TiN or Co/TiN or Ta/TiN is penetrating through the insulating layer 815 and the n+ source (cathode) region 807 and further extending into the P body region 805. Underneath each of the source (cathode) trenched contact 817, a p+ heavily doped contact region 806 is formed within the P body region 805 and surrounding sidewall and bottom of the source (anode) trenched contact 817 below the n+ source (anode) region 807 to reduce the contact resistance between the tungsten plug 821 and the P body region 805, wherein the p+ heavily doped contact region 806 has a higher doping concentration than the P body region 805. An n+ drain region 808 is formed near the top surface of the epitaxial layer 803 and spaced apart from the P body region 805, and a p+ anode region 809 is formed within the epitaxial layer 803 and below the n+ drain region 808, meanwhile, an n* breakdown voltage enhancement doped region 816 is formed contacting to the n+ drain region 808 and wrapping around the p+ anode region 809, wherein the n* breakdown voltage enhancement doped region 816 has a doping concentration higher than the epitaxial layer 803 but lower than the n+ drain region 808. A drain-anode adjoining trenched contact 816 filled with a tungsten plug 820 padded by the barrier layer is penetrating through the insulating layer 815 and the n+ drain region 808 and further extending into the p+ anode region 809. A gate trenched contact filled with a tungsten plug 822 padded by the barrier layer is penetrating through the insulating layer 815 and extending into the doped poly-silicon layer within the second type trenched gate 803. Onto the insulating layer 815, a gate metal 812, a source (cathode) metal 811 and a drain-anode metal 813 of Al alloys which is optionally padded by a resistance-reduction layer of Ti or TiN is formed to be electrically connected to the tungsten metal plug 822, the tungsten plug 821 and the tungsten plug 820, respectively. Another preferred embodiment has a similar configuration to the LIGBT 800 except that there is no n* breakdown voltage enhancement doping region.

Figure 10:
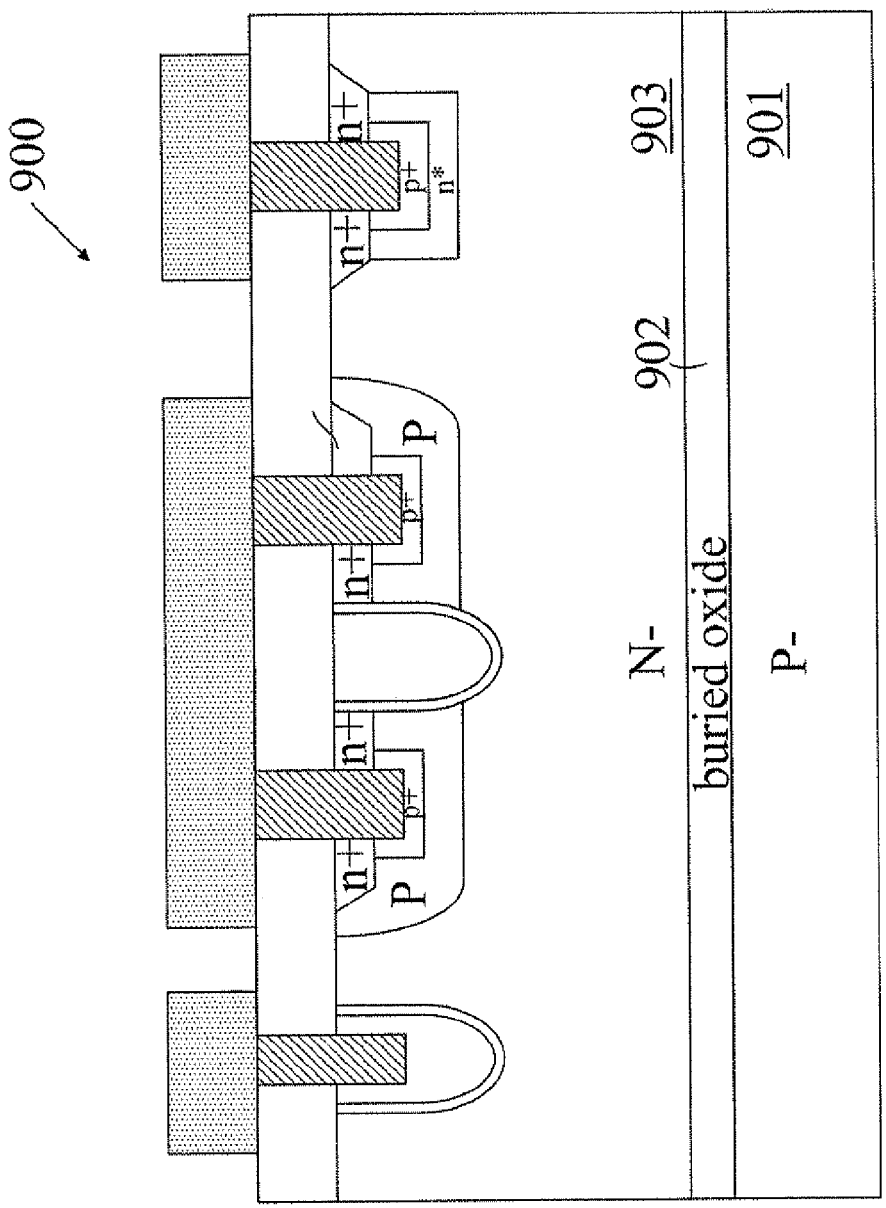
FIG. 10 is a cross sectional view showing another preferred embodiment of the present invention.

FIG. 10 is a cross sectional view showing a LIGBT 900 according to another preferred embodiment of the present invention which has a similar configuration to the LIGBT 800 in FIG. 9 except that, a buried oxide layer 902 is disposed between an epitaxial layer 903 and a substrate 901 for further enhancing breakdown voltage.

Figure 11:
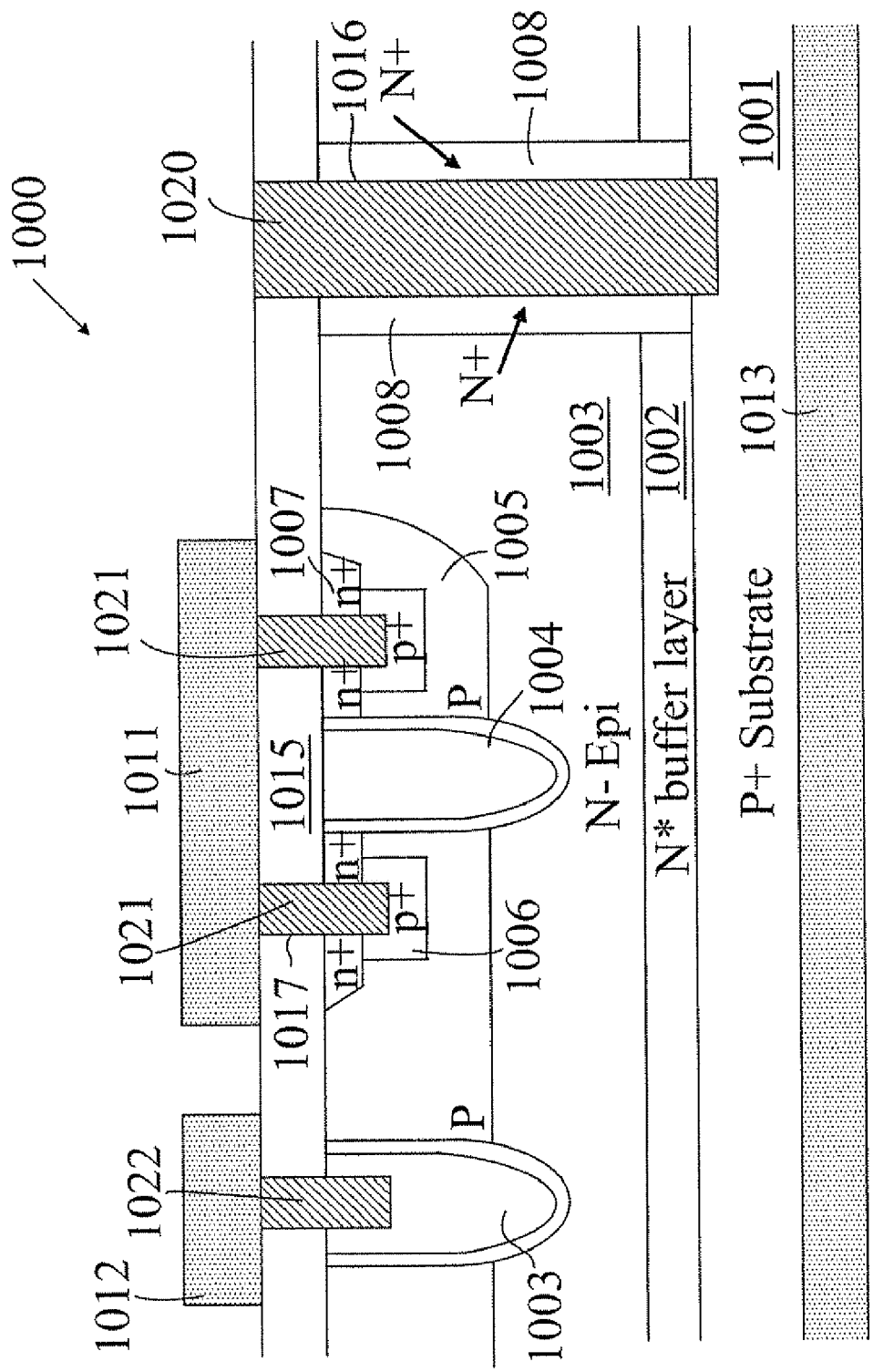
FIG. 11 is a cross sectional view showing another preferred embodiment of the present invention.

FIG. 11 is a cross sectional view showing a hybrid IGBT comprising VIGBT (Vertical IGBT)-LDMOS 1000 according to another preferred embodiment of the present invention. The hybrid VIGBT-LDMOS 1000 is formed in an epitaxial layer 1003 of a first conductivity type, here n-type, grown onto top surface of a semiconductor substrate 1001 of a second conductivity type, here p-type. Between the epitaxial layer 1003 and the substrate 1001, there is an N* buffer epitaxial layer 1002 having higher doping concentration than the epitaxial layer 1003. At least a first type trenched gate 1004 in active area and at least a second type trenched gate 1003 in gate contact area which are implemented by filling doped poly-silicon layers in a plurality of gate trenches in the epitaxial layer 1003. An n+ source (cathode) region 1007 are formed near top surface of the epitaxial layer 1003 and surrounding top portion of sidewalls of the first type trenched gate 1004, wherein the n+ source (cathode) region 1007 has a higher doping concentration than the epitaxial layer 1003. A P body region 1005 is formed within the epitaxial layer 1003 and encompassing the n+ source (cathode) region 1007 and forming a channel region along the sidewalls of the first type trenched gate 1004, wherein the P body region 1005 surrounds lower portion of the sidewalls of the first type trenched gate 1004. Each of a plurality of source (cathode) trenched contacts 1017 filled with a tungsten plug 1021 padded by a barrier layer of Ti/TiN or Co/TiN or Ta/TiN is penetrating through the insulating layer 1015 and the n+ source (cathode) region 1007 and further extending into the P body region 1005. Underneath each of the source (cathode) trenched contact 1017, a p+ heavily doped contact region 1006 is formed within the P body region 1005 and surrounding sidewall and bottom of the source (anode) trenched contact 1017 below the n+ source (anode) region 1007 to reduce the contact resistance between the tungsten plug 1021 and the P body region 1005, wherein the p+ heavily doped contact region 1006 has a higher doping concentration than the P body region 1005. A gate trenched contact filled with a tungsten plug 1022 padded by the barrier layer is penetrating through the insulating layer 1015 and extending into the doped poly-silicon layer within the second type trenched gate 1003. An N+ vertical drain region 1008 is formed adjacent to sidewalls of a drain trenched contact 1016, wherein the N+ vertical drain region 1008 is extending from top surface of the epitaxial layer 1003, penetrating through the epitaxial layer 1003 and the N* buffer epitaxial layer 1002 and to top surface of the substrate 1001 while the drain trenched contact 1016 filled with a conductive plug 1020 of doped poly-silicon or tungsten plug is penetrating through the insulating layer 1005, the epitaxial layer 1003 as well as the N* buffer epitaxial layer 1002 and extending into the substrate 1001. Onto the insulating layer 1015, a gate metal 1012, a source (cathode) metal 1011 which is optionally padded by a resistance-reduction layer of Ti or TiN is formed to be electrically connected to the tungsten metal plug 1022, the tungsten plug 1021, respectively. Onto bottom surface of the substrate 1001, a drain-anode metal 1013 such as Ti/Ni/Ag is formed connecting with the n+ vertical drain region 1008 by the drain trenched contact 1016. In another preferred embodiment, the N+ vertical drain region 1008 surrounding not only sidewalls but also bottom of the drain trenched contact 1016.

Another preferred embodiment has similar cross sectional view of the FIG. 11 except that the drain trenched contact penetrates the insulation layer and extends into the epitaxial layer but does not further extend to the substrate. The N+ drain region surrounds sidewalls and bottom of the drain trenched contact and contacts to a drain metal over the insulation layer through the metal plug filled into the drain trenched contact. The drain metal connects to an anode metal on the bottom surface of the substrate through bonding wires, bonding ribbon or copper clips in a package.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A lateral insulated gate bipolar transistor (LIGBT) comprising:
    a drain-anode adjoining trenched contact penetrating through an insulating layer and extending into an epitaxial layer of a first conductivity type, directly contacting to a drain region having said first conductivity type and an anode region of a second conductivity type; and
    said drain region vertically contacting to said anode region along sidewalls of said drain-anode adjoining trenched contact.

2. The LIGBT of claim 1, wherein said drain region surrounds upper portion of the sidewalls of said drain-anode adjoining trenched contact and said anode region surrounds lower portion of the sidewalls of said drain-anode adjoining trenched contact and wraps around bottom of said drain-anode adjoining trenched contact.

3. The LIGBT of claim 2 further comprising a breakdown voltage enhancement doping region of said first conductivity type wrapping around at least said anode region, wherein said breakdown voltage enhancement doping region has a doping concentration lower than said drain region but higher than said epitaxial layer.

4. The LIGBT of claim 1 wherein said anode region surrounds upper portion of the sidewalls of said drain-anode adjoining trenched contact and said drain region surrounds lower portion of the sidewalls of said drain-anode adjoining trenched contact and wraps around bottom said trenched contact.

5. The LIGBT of claim 4, further comprising a breakdown voltage enhancement doping region of said first conductivity type wrapping around at least said anode region, wherein said breakdown voltage enhancement doping region has a doping concentration lower than said drain region but higher than said epitaxial layer.

6. The LIGBT of claim 1 further comprising:
    at least a trenched gate in active area;
    a source (cathode) trenched contact penetrating through said insulating layer and a source (cathode) region having said first conductivity type, and further extending into a body region of said second conductivity type within said epitaxial layer;
    said source (cathode) region is formed near top surface of said epitaxial layer and surrounding top portion of sidewalls of said trenched gate, encompassed in said body region; and a heavily doped contact region having said second conductivity type within said body region and below said source (cathode) region surrounding sidewalls and bottom of said source (cathode) trenched contact.

7. The LIGBT of claim 6 further comprises a gate trenched contact penetrating through said insulating layer and extending into a trenched gate in gate contact area.

8. The LIGBT of claim 6, wherein said trenched gate is padded by a gate oxide layer and filled with a doped polysilicon layer.

9. The LIGBT of claim 1, further comprising:
a planar gate;
a source (cathode) trenched contact penetrating through said insulating layer and a source (cathode) region having said first conductivity type, and further extending into a first body region having said second conductivity type within said epitaxial layer;
a second body region disposed within said first body region and at least surrounding bottom of said source region, having said second conductivity type with doping concentration higher than said first body region;
a heavily doped contact region having said second conductivity type within said second body region and below said source (cathode) region and surrounding sidewalls and bottom of said source (cathode) trenched contact.

10. The LIGBT of claim 1, wherein said drain-anode adjoining trenched contact is filled with Ti/TiN/Al or Co/TiN/Al or Ta/TiN/Al alloys as drain-anode metal layer.

11. The LIGBT of claim 1, wherein said drain-anode adjoining trenched contact is filled with Ti/TiN/W or Co/TiN/W or Ta/TiN/W as metal plug.

12. The LIGBT of claim 11 further comprising an Al alloys connecting with said metal plug as drain-anode metal layer.

13. The LIGBT of claim 12, further comprising a Ti or Ti/TiN layer underneath said drain-anode metal layer as intermetal contact resistance-reduction layer.

14. The LIGBT of claim 1, wherein said epitaxial layer grown on a substrate of a second conductivity.

15. The LIGBT of claim 14, further comprising a buried oxide layer on top surface of said substrate.

16. The LIGBT of claim 1 is a discrete device on single chip.

17. The LIGBT of claim 1 is integrated with a control IC on single chip.

* * * * *